United States Patent [19]

Oku

[11] Patent Number: 5,077,499

[45] Date of Patent: Dec. 31, 1991

[54] HIGH-FREQUENCY FEEDING METHOD FOR USE IN PLASMA APPARATUS AND DEVICE FOR CARRYING OUT THE METHOD

[75] Inventor: Kouji Oku, Fukuoka, Japan

[73] Assignee: Mitsubishi Denki Kabushiki Kaisha, Japan

[21] Appl. No.: 616,994

[22] Filed: Nov. 21, 1990

[30] Foreign Application Priority Data

Apr. 18, 1990 [JP] Japan .................................. 2-100356

[51] Int. Cl.$^5$ .............................................. H05H 1/24
[52] U.S. Cl. ......................... 315/111.21; 313/231.31; 333/32
[58] Field of Search ...................... 315/111.21, 111.81; 313/231.31; 331/74; 333/32

[56] References Cited
U.S. PATENT DOCUMENTS

| | | | |
|---|---|---|---|
| 3,569,777 | 3/1971 | Beaudry | 315/111.21 |
| 4,792,732 | 12/1988 | O'Loughlin | 315/111.21 X |
| 4,877,999 | 10/1989 | Knapp et al. | 313/231.31 X |
| 4,887,005 | 12/1989 | Rough et al. | 315/111.21 |
| 4,956,582 | 9/1990 | Bourassa | 315/111.21 |

*Primary Examiner*—Eugene R. LaRoche
*Assistant Examiner*—Do Hyun Yoo
*Attorney, Agent, or Firm*—Leydig, Voit & Mayer

[57] ABSTRACT

In a plasma apparatus, electric power is transmitted from a high-frequency power supply to an electrode in a plasma chamber through a feeding cable. A stub connected to the feeding cable as a matching component removes the capacitive component of the impedance of a plasma produced in the plasma chamber and equalizes the resistive component of the impedance of the plasma to the characteristic impedance of the feeding cable. As a result, the impedance of the plasma and the characteristic impedance of the feeding cable are matched, and the transmitting efficiency of the electric power is enhanced. A phase shift circuit may be used instead of the stub.

12 Claims, 5 Drawing Sheets

HIGH-FREQUENCY FEEDING METHOD FOR USE IN PLASMA APPARATUS AND DEVICE FOR CARRYING OUT THE METHOD

BACKGROUND OF THE INVENTION

1. Field of the Invention

The present invention relates to a feeding method and a feeding device with high-frequency excitation for use in a plasma apparatus.

2. Description of the Related Art

In a general plasma apparatus, an electrode is disposed in a reaction chamber and a high-frequency power supply is connected to the electrode through a matching box. It is intended that the matching box matches the power supply impedance of the high-frequency power supply to the impedance of a plasma produced in the reaction chamber, the matching box being composed of lumped parameter circuit elements.

The matching box and the electrode in the reaction chamber are connected through a feeding cable. Where the electrical length of the feeding cable is short enough to be ignored, for example, when it is shorter than approximately 25 cm, the electrode can be substantially directly connected to the output side of the matching box and it is still possible to effectively transmit the electric power. However, in reality, it is difficult to mount the matching box near the electrode due to the inside and outside structure of the reaction chamber, and in such a case, the electrical length of the feeding cable is not short enough to be ignored. Therefore, when the matching box cannot be mounted near the electrode, standing waves are caused by reflections in the feeding cable, the feeding cable has an increased electric power loss, and the transmitting efficiency of the electric power is lowered.

Conventionally, in order to decrease the standing wave ratio in the feeding cable, as shown in FIG. 11, a plurality of coaxial cables 3 used as feeding cables are arranged in parallel so as to feed the electric power from a matching box 4 to an electrode 2 in a plasma chamber 1.

Assuming that the inductance and the capacitance of the coaxial cable per unit length are respectively $L_0$ and $C_0$, the characteristic impedance $Z_c$ of the cable is represented by the following equation:

$$Z_c = (L_0/C_0)^{\frac{1}{2}} \qquad [1]$$

If N such cables are connected in parallel, the inductance is $L_0/N$, the capacitance is $NC_0$, and the characteristic impedance $Z_{c_1}$ is:

$$Z_{c_1} \approx \{(L_0/N)/NC_0\}^{\frac{1}{2}} = Z_c/N \qquad [2]$$

For example, if two coaxial cables having the characteristic impedance of 50Ω are connected in parallel, the characteristic impedance is 25Ω. Therefore, by connecting a plurality of coaxial cables in parallel, it is possible to bring the characteristic impedance of the feeding cable close to the value of the plasma impedance.

However, since the plasma impedance is a capacitive load, it is difficult to achieve a perfect match the above method, and there is a problem that standing waves in the feeding cable lower the transmitting efficiency of the electric power.

SUMMARY OF THE INVENTION

The present invention is intended to solve such above problems and an object of the present invention is to provide a high-frequency feeding method for use in a plasma apparatus, which can effectively transmit electric power from a high-frequency power supply to an electrode in the plasma apparatus.

Another object of the present invention is to provide a high-frequency feeding device for use in a plasma apparatus, which can effectively transmit electric power to an electrode in the plasma apparatus.

The high-frequency feeding method according to the present invention comprises the steps of transmitting high-frequency electric power from a high-frequency power supply to an electrode in a plasma apparatus through a feeding cable, removing the capacitive component of the impedance of the plasma produced in the plasma apparatus, equalizing the resistive component of the impedance of the plasma with the characteristic impedance of the feeding cable, and thereby matching the characteristic impedance of the feeding cable and the impedance of the plasma.

The high-frequency feeding device according to the present invention for feeding high-frequency electric power to an electrode in a plasma apparatus comprises a high-frequency power supply for producing high-frequency electric power, a feeding cable connecting the high-frequency power supply and the electrode in the plasma device, and a matching means for matching the characteristic impedance of the feeding cable and the impedance of the plasma by removing the capacitive component of the impedance of the plasma produced in the plasma apparatus and equalizing the resistive component of the impedance of the plasma with the characteristic impedance of the feeding cable.

The matching means may be composed of at least a stub connected to the feeding cable or of a phase shift circuit having three stubs connected to the feeding cable.

DESCRIPTION OF THE PREFERRED EMBODIMENTS

The embodiments of the present invention will now be described with reference to the accompanying drawings.

Figure 1:
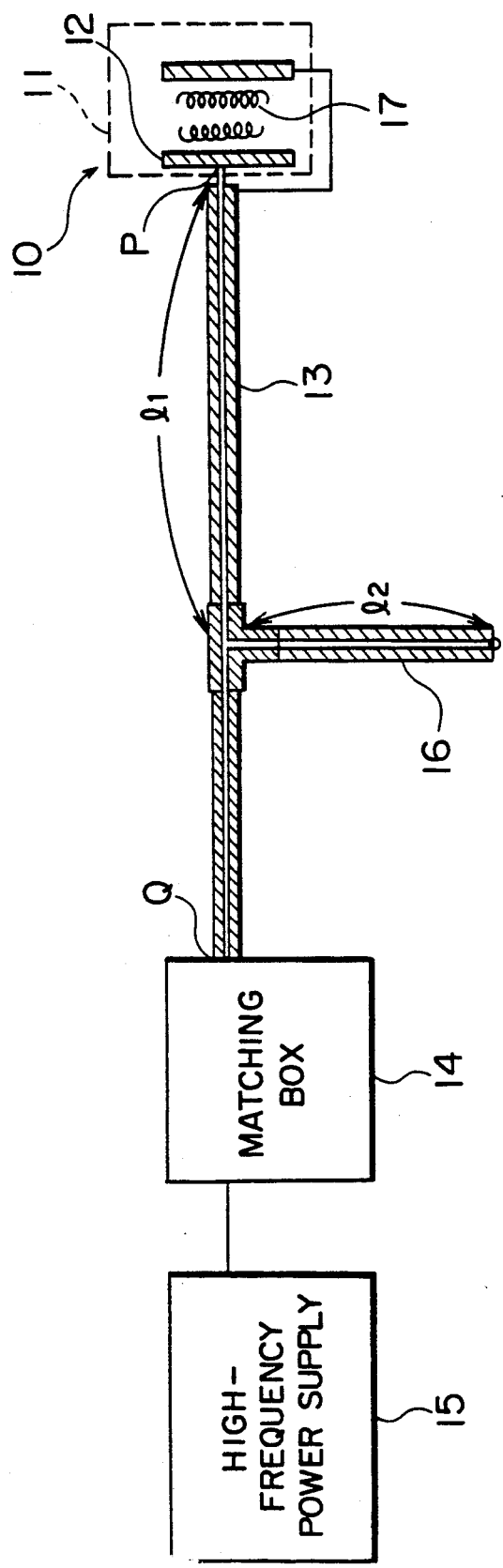
FIG. 1 is a block diagram of a high-frequency feeding device in a plasma apparatus according to a first embodiment of the present invention.

As shown in FIG. 1, a pair of discharge electrodes 12 are disposed in a plasma chamber 11 of a plasma apparatus 10, and one end P of a feeding cable 13, which is a coaxial cable, is connected to the electrodes 12. To the other end Q of the feeding cable 13, a high-frequency power supply 15 is connected through a matching box 14 which is composed of lumped circuit elements. A stub 16 composed of a coaxial cable having the length $l_2$, and whose leading end is short-circuited, is connected to a portion at the feeding cable 13 a length $l_1$ from the one end P of the same. The stub 16 constitutes a matching means.

Figure 2:
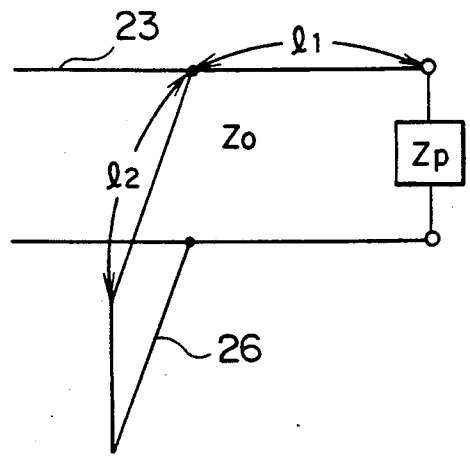
FIG. 2 is a schematic view illustrating a principle of the first embodiment.

The principle of this embodiment is illustrated in FIG. 2. As shown in FIG. 2, a plasma impedance Zp as a load is connected to one end of a feeding cable 23, and a cable 26 whose leading end is short-circuited and which has the length $l_2$ is connected at a length $l_1$ from the load end of the feeding cable 23. $Z_0$ is the characteristic impedance of the feeding cable 23.

In general, when a reflection is caused in a high-frequency feeding cable, the impedance Zl of the feeding cable varies in accordance with the electrical length of the cable and is represented as follows:

$$Zl = Z_0(Zp + jZ_0\tan\beta l)/(Z_0 + jZp\tan\beta l) \quad [3]$$
$$= Z_0(Zp + j\tan\beta l)/(1 + jzp\tan\beta l)$$

where Zp is the normalized plasma impedance, and $\beta l$ is the electrical length converted from the cable length l from the load end of the feeding cable 23 and has a phase value.

The above equation [3] can be converted into the following equation [4] in terms of admittance:

$$yl = 1/Zl \quad [4]$$
$$= (1/Z_0)(Z_0 + jZp\tan\beta l)/(Zp + jZ_0\tan\beta l)$$
$$= Y_0\{1 + j(1/yp)\tan\beta l\}/\{(1/yp) + j\tan\beta l\}$$
$$= Y_0(yp + j\tan\beta l)/(1 + jyp\tan\beta l)$$

where yl is the admittance for the electrical length $\beta l$, $Y_0$ is the admittance of the feeding cable, and $y_p$ is the standardized admittance of the plasma.

Figure 3:
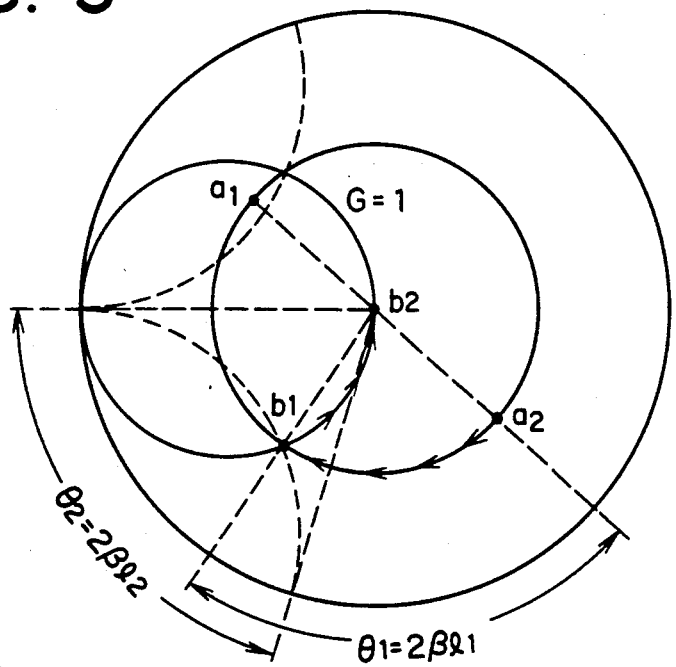
FIG. 3 is a Smith chart explaining operation of the first embodiment.

The equations [3] and [4] are illustrated by the Smith chart shown in FIG. 3. The Smith chart can be used as both an impedance chart and an admittance chart. As shown in FIG. 3, assuming that the impedance Zp, which is obtained by standardizing the plasma impedance Zp to the characteristic impedance $Z_0$ of the feeding cable, is the point $a_1$, the point $a_2$, which the point $a_1$ reaches upon a turn of 180°, corresponds to the standardized admittance $y_p$. Then the point $a_2$ is further turned toward the power supply so as to reach the point $b_1$ on a conductance line where the admittance $G=1$.

Next, the point $b_1$ is moved to a matching point $b_2$ along the conductance line where the admittance $G=1$. Assuming that the imaginary part is $+jx$, since the admittance of the point $b_1$ is represented by $1+jx$, the point $b_1$ is moved to the point $b_2$ by connecting the admittance $-jx$ having an opposite sign to the point $b_1$ in a row, and then the matching can be performed.

In the Smith chart, a half wave causes a 360° turn. Therefore, the length $l_1$ from the load end of the feeding cable 23 shown in FIG. 2 and the length $l_2$ of the cable 26 with a short-circuited leading end are determined so that the electrical angle $\theta_1$ in the movement from the point $a_2$ to the point $b_1$ and the electrical angle $\theta_2$ in the movement from the point $b_1$ to the point $b_2$ are respectively:

$$\theta_1 = 2\beta l_1 \quad [5]$$

$$\theta_2 = 2\beta l_2 \quad [6]$$

As a result, the point $a_1$ is moved to the matching point $b_2$, the capacitive component of the plasma impedance Zp is cancelled by the capacitive component of the impedance of the feeding cable and the resistive component of the plasma impedance Zp is equalized to the resistive component of the characteristic impedance $Z_0$ of the feeding cable 23. In other words, the characteristic impedance $Z_0$ of the feeding cable 23 and the plasma impedance Zp are completely matched.

In the embodiment shown in FIG. 1, the circuit shown in FIG. 2 is formed with coaxial cables. The high-frequency electric power is transmitted from the high-frequency power supply 15 to the electrodes 12 in the plasma apparatus 10 through the matching box 14 and the feeding cable 13. On the other hand, the inside of the plasma chamber 11 is filled with reaction gas having a predetermined pressure. As a result, plasma 17 is produced in the plasma chamber 11.

At this time, the capacitive component of the impedance of the plasma 17 is removed by the stub 16 connected to the feeding cable 13, and the resistive component of the impedance of the plasma 17 is equalized to the characteristic impedance of the feeding cable 13. In other words, the characteristic impedance of the feeding cable 13 and the impedance of the plasma 17 are matched. Therefore, the transmitting efficiency of the high-frequency electric power is enhanced, and it is possible to increase the strength of the plasma 17.

The feeding cable 13 may be formed of a copper plate strap and the like instead of a coaxial cable.

Figure 4:
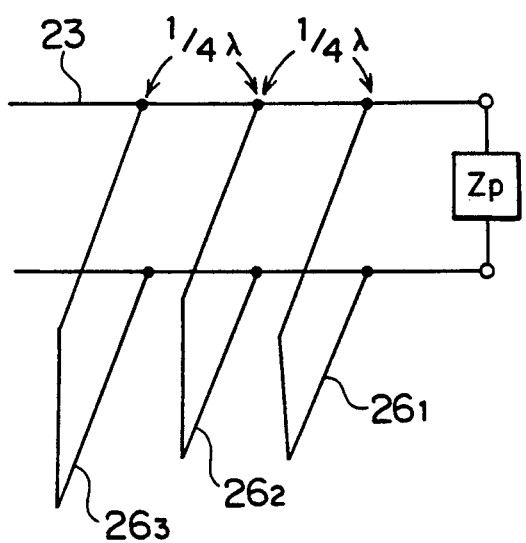
FIG. 4 is a schematic view illustrating a principle of a variation of the first embodiment.

As shown in FIG. 4, if a parallel stub is formed by connecting three cables, each with a short-circuited leading end, $26_1$ to $26_3$ respectively at intervals of $\frac{1}{4}$ wavelength ($\frac{1}{4} \lambda$) from each other to the feeding cable 23, any plasma impedance Zp can be matched in spite of the position where the stub is connected to the feeding cable 23.

Figure 5:
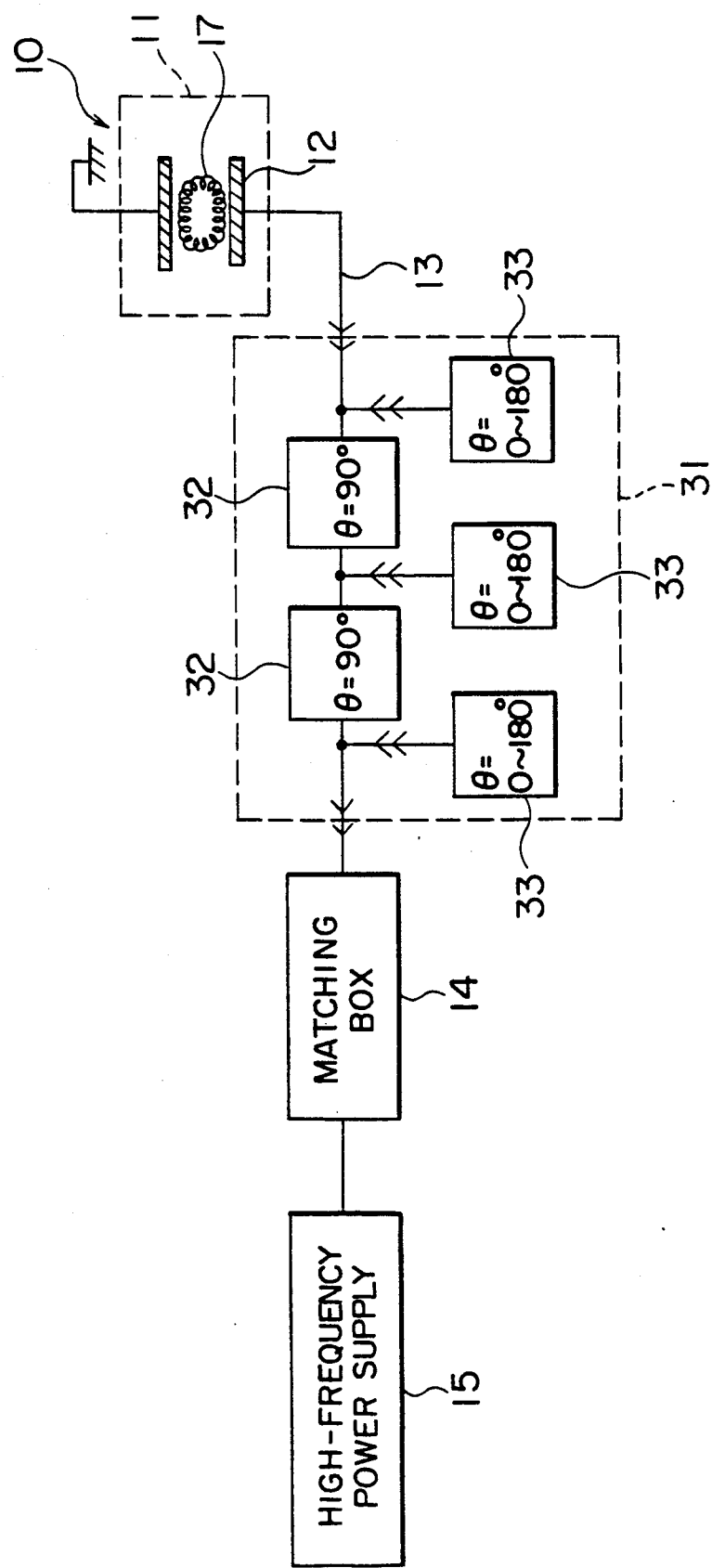
FIG. 5 is a block diagram of a second embodiment of the present invention.
Figure 6:
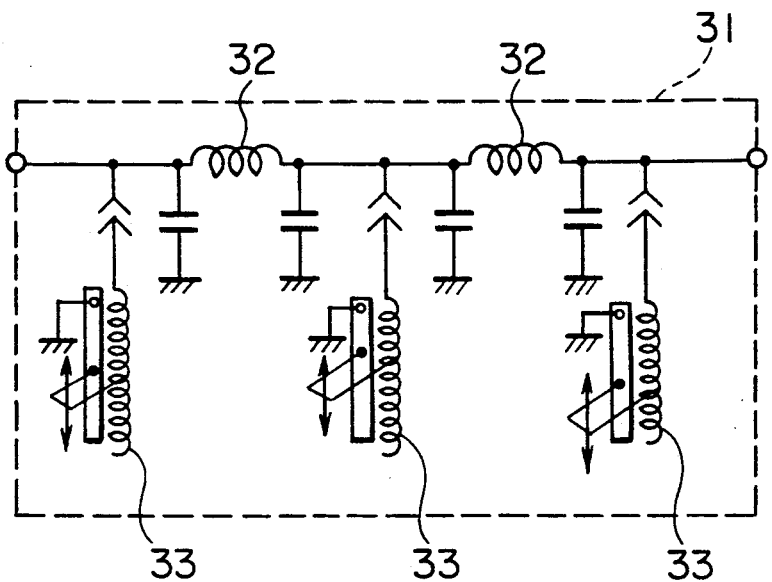
FIG. 6 is a circuit diagram of a phase shift circuit for the second embodiment.

FIG. 5 is a block diagram of the second embodiment of the present invention. In the second embodiment, a phase shift circuit 31 is connected to the feeding cable 13 as a matching means instead of the stub 16 used in the first embodiment shown in FIG. 1. The phase shift circuit 31 comprises two 90° phase shifters 32 respectively corresponding to $\frac{1}{4}$ wave cables and three 0°–180° variable phase shifters 33 respectively corresponding to variable length stubs. Specifically, as shown in FIG. 6, the 90° phase shifter 32 is formed by a $\pi$ circuit including an inductance and two capacitances, and the variable phase shifter 33 is formed by a phase shifter which can slidingly change inductance and capacitance.

Figure 7:
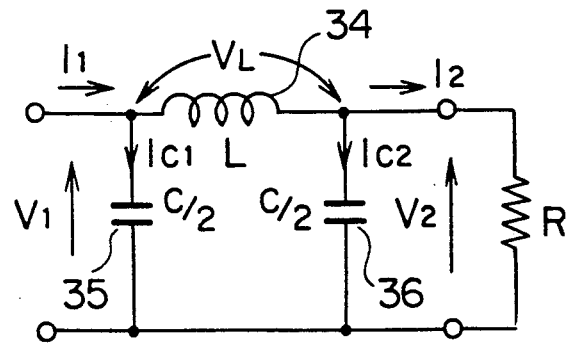
FIG. 7 is a circuit diagram of a 90° phase shifter for the phase shift circuit shown in FIG. 6.
Figure 8:
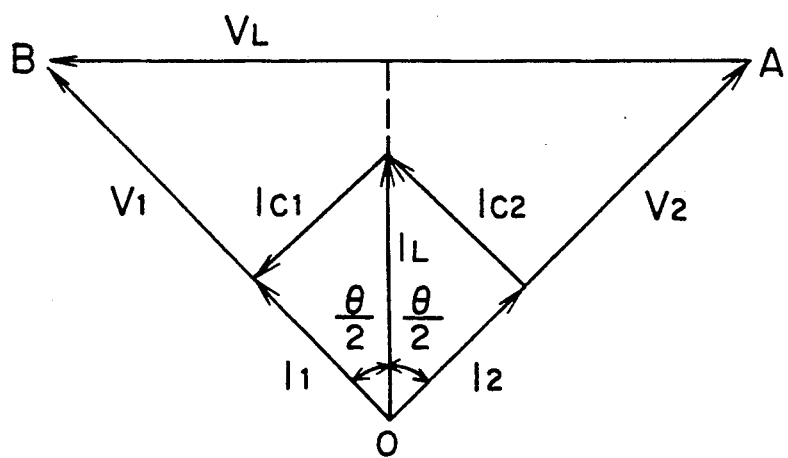
FIG. 8 is a vector diagram of the 90° phase shifter shown in FIG. 7.

The composition of the $\pi$ circuit which forms each of the 90° phase shifters 32 is shown in FIG. 7, wherein the characteristic impedance is R$\Omega$. Condensers 35 and 36 respectively having a capacitance of C/2 are connected to respective ends of a coil 34 having an inductance L. In this $\pi$ circuit, if it is assumed that the input voltage and current are $V_1$ and $I_1$, the voltage and current of the coil 34 are $V_L$ and $I_L$, respectively, the output voltage and current are $V_2$ and $I_2$, respectively, the currents flowing through the condensers 35 and 36 are $I_{C1}$ and $I_{C2}$, respectively, and the phase shift angle is $\theta$, then these factors are related to each other as shown in the vector diagram in FIG. 8. Furthermore, assuming the angular frequency is $\omega$, the following equations apply:

$$\begin{aligned} \omega L &= |V_L|/|I_L| \quad &[7] \\ &= 2 \cdot |V_2| \cdot \sin(\theta/2)/|I_2| \cdot \cos(\theta/2) \\ &= 2R \cdot \sin(\theta/2)\cos(\theta/2) \\ &= R \cdot \sin\theta \end{aligned}$$

$$\begin{aligned} \omega C/2 &= |I_{C2}|/|V_2| \quad &[8] \\ &= |I_2| \cdot \tan(\theta/2)/|V_2| \\ &= (1/R)\tan(\theta/2) \end{aligned}$$

When the frequency is 13.56 MHz, $\Omega$ is 90°, and R is 50$\Omega$, L and C are found based on the equations [7] and [8] as follows:

$$L \approx 0.705 \, \mu H$$

$$C \approx 470 \, pF$$

Therefore, if the $\pi$ circuit shown in FIG. 7 is formed by the coil 34 whose inductance L is 0.705 $\mu$H and the condensers 35 and 36 whose capacitance C/2 is 235 pF, a 90° phase shifter having R of 50$\Omega$ is obtained.

Figure 9:
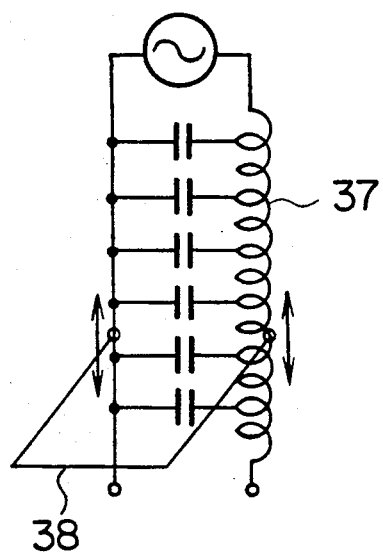
FIGS. 9 and 10 are circuit diagrams illustrating a principle of a variable phase shifter in the phase shift circuit shown in FIG. 6.
Figure 10:
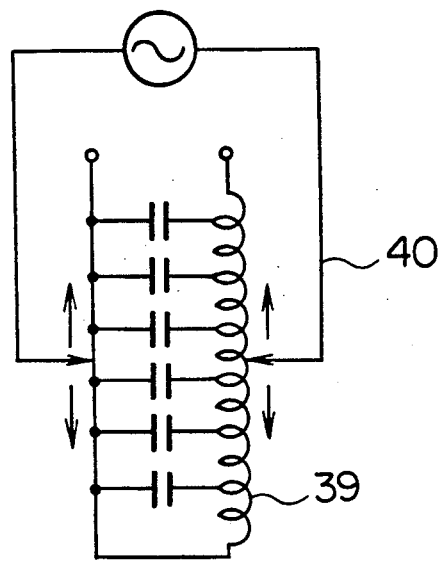
Figure 11:
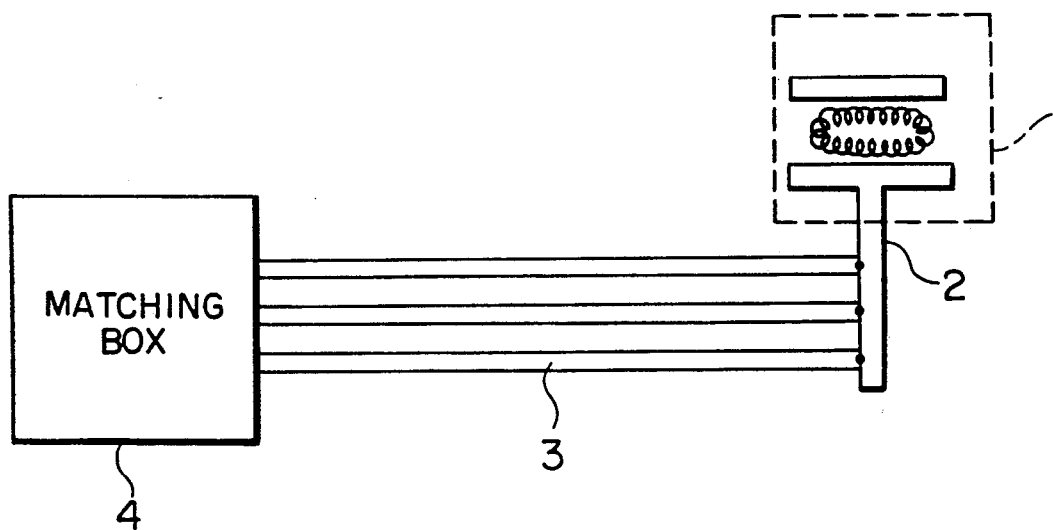
FIG. 11 is a block diagram showing part of a conventional high-frequency feeding device.

On the other hand, in each of the variable phase shifters 33, a short-circuited slider 38 may slide on a coil 37 whose leading end is open as shown in FIG. 9, or a slider may slide on a coil 39 whose leading end is short-circuited as shown in FIG. 10. In the variable phase shifters 33 of this kind, since the inductance and the capacitance are slidingly changed, the inductance and the capacitance per unit length are given by the above equations [7] and [8] with a resolution 1°-2° of the phase shift angle $\theta$. Furthermore, a power delay circuit, which is sold on the market, can be used as each of the variable phase shifters 33.

By combining two of the above 90° phase shifters 32 and three of the above variable phase shifters 33 as shown in FIG. 5, the phase shift circuit 31, which functions in the same manner as the matching means with three stubs shown in FIG. 4, is formed. If the parallel stub shown in FIG. 4 is formed in the band of 13.56 MHz, which is often used to form the plasma, each of the respective lengths of the cables, each with a short-circuited leading end, $26_1$ to $26_3$ becomes longer and the high-frequency feeding device has to be made bigger. However, the phase shift circuit 31 in the second embodiment can be made smaller. Furthermore, it is possible to incorporate the phase shift circuit 31 into the high-frequency power supply 15 shown in FIG. 5 and omit the matching box 14 mounted outside. Thus, the high-frequency feeding device can be made even smaller.

What is claimed is:

1. A method of feeding high-frequency electrical power to a plasma in a plasma apparatus comprising:

initiating the plasma in the plasma apparatus, the plasma having an impedance including a resistive component and a capacitive component;

transmitting high-frequency electrical power from a power supply to an electrode in the plasma apparatus through a feeding cable having a characteristic impedance including a resistive component and a reactive component to sustain the plasma in the plasma apparatus; and matching the characteristic impedance of said feeding cable to the impedance of the plasma produced in said plasma apparatus so that the capacitive component of the impedance of the plasma and the reactive component of the impedance of said feeding cable cancel each other and the resistive components of the impedances of the plasma and said feeding cable are substantially equal.

2. A feeding device for supplying high-frequency electrical power to an electrode in a plasma apparatus comprising:

the plasma apparatus including the electrode for establishing and sustaining plasma in the apparatus in a reaction gas, the plasma being sustained by high-frequency electrical energy supplied to the plasma, the plasma having an impedance including a capacitive component and a resistive component;

a power supply for producing high-frequency electrical energy;

a feeding cable having a characteristic impedance including a resistive component and a reactive component connecting said power supply to said electrode in said plasma apparatus; and matching means for matching the characteristic impedance of said feeding cable to the impedance of the plasma produced in said plasma apparatus by cancelling the capacitive component of the impedance of the plasma with the reactive component of the impedance of said feeding cable and equalizing the resistive components of the impedances of the plasma and said feeding cable.

3. A feeding device as claimed in claim 2, wherein said matching means includes at least one stub connected to said feeding cable.

4. A feeding device as claimed in claim 3, wherein said matching means includes three stubs connected in parallel, each stub including a first short-circuited end and a second end connected to said feeding cable, said stubs being respectively connected to said feeding cable at intervals of ¼ wavelength of the high-frequency electrical energy.

5. A feeding device as claimed in claim 2, wherein said matching means is a phase shift circuit including three stubs connected to said feeding cable.

6. A feeding device as claimed in claim 5, wherein said phase shift circuit comprises two 90° phase shifters respectively connected to said feeding cable in series, first and second variable phase shifters connected to said feeding cable, and a third variable phase shifter connected to said feeding cable between said two 90° phase shifters.

7. A feeding device as claimed in claim 6, wherein said 90° phase shifters respectively include a $\pi$ circuit including a inductance and two capacitances.

8. A feeding device as claimed in claim 6, wherein said variable phase shifters respectively comprise a coil having first and second ends, said first end being connected to said feeding cable and said second end being electrically open, and a sliding tap sliding on said coil to vary the phase shift.

9. A feeding device as claimed in claim 6, wherein said variable phase shifters respectively comprise a coil having first and second ends, said first end being connected to said feeding cable and said second end being short-circuited, and a sliding tap sliding on said coil to vary the phase shift.

10. A feeding device as claimed in claim 6, wherein said variable phase shifters respectively comprise a power delay circuit.

11. A feeding device as claimed in claim 2, wherein said feeding cable is a coaxial cable.

12. A feeding device as claimed in claim 2, wherein said feeding cable is a copper plate strap.

* * * * *

UNITED STATES PATENT AND TRADEMARK OFFICE
CERTIFICATE OF CORRECTION

PATENT NO. : 5,077,499

DATED : December 31, 1991

INVENTOR(S) : Kouji Oku

It is certified that error appears in the above-identified patent and that said Letters Patent is hereby corrected as shown below:

```
Column 3, line 34, change "Zo(Zp + jtanθl)/(1 +
jzptanθl) to --Zo(zp + jtanθl)/(1 + jzptanθl)--.

Column 5, line 24, changing "Ω" to --θ--.
```

Signed and Sealed this

Eighth Day of June, 1993

Attest:

MICHAEL K. KIRK

*Attesting Officer*   *Acting Commissioner of Patents and Trademarks*